US008772757B2

(12) United States Patent
Emerson et al.

(10) Patent No.: US 8,772,757 B2
(45) Date of Patent: Jul. 8, 2014

(54) DEEP ULTRAVIOLET LIGHT EMITTING DEVICES AND METHODS OF FABRICATING DEEP ULTRAVIOLET LIGHT EMITTING DEVICES

(75) Inventors: David Todd Emerson, Chapel Hill, NC (US); Michael John Bergmann, Chapel Hill, NC (US); Amber Abare, Cary, NC (US); Kevin Haberern, Cary, NC (US)

(73) Assignee: Cree, Inc., Durham, NC (US)

( * ) Notice: Subject to any disclaimer, the term of this patent is extended or adjusted under 35 U.S.C. 154(b) by 468 days.

(21) Appl. No.: 12/030,539

(22) Filed: Feb. 13, 2008

(65) Prior Publication Data

US 2008/0142783 A1    Jun. 19, 2008

Related U.S. Application Data

(62) Division of application No. 11/140,384, filed on May 27, 2005, now abandoned.

(51) Int. Cl.
*H01L 29/06*    (2006.01)

(52) U.S. Cl.
USPC ............ 257/13; 257/14; 257/103; 257/190; 257/E21.108; 257/E21.121; 257/E21.125

(58) Field of Classification Search
USPC .............................. 257/13–14, 103, 190, 627
See application file for complete search history.

(56) References Cited

U.S. PATENT DOCUMENTS

| 5,182,670 A | 1/1993 | Khan et al. |
| 5,210,051 A | 5/1993 | Carter, Jr. |

(Continued)

FOREIGN PATENT DOCUMENTS

| EP | 1 508 923 A2 | 2/2005 |
| JP | 6-268257 A | 9/1994 |

(Continued)

OTHER PUBLICATIONS

Adivarahan et al., "AlGaN single-quantum-well Light-emitting diodes with emission at 285 nm" *Applied Physics Letters* 81(19):3666-3668 (2002).

(Continued)

*Primary Examiner* — A. Sefer
(74) *Attorney, Agent, or Firm* — Myers Bigel Sibley & Sajovec, P.A.

(57) ABSTRACT

Light emitting devices and methods of fabricating light emitting devices that emit at wavelengths less than 360 nm with wall plug efficiencies of at least than 4% are provided. Wall plug efficiencies may be at least 5% or at least 6%. Light emitting devices and methods of fabricating light emitting devices that emit at wavelengths less than 345 nm with wall plug efficiencies of at least than 2% are also provided. Light emitting devices and methods of fabricating light emitting devices that emit at wavelengths less than 330 nm with wall plug efficiencies of at least than 0.4% are provided. Light emitting devices and methods of fabricating light emitting devices having a peak output wavelength of not greater than 360 nm and an output power of at least 5 mW, having a peak output wavelength of 345 nm or less and an output power of at least 3 mW and/or a peak output wavelength of 330 nm or less and an output power of at least 0.3 mW at a current density of less than about 0.35 $\mu A/\mu m^2$ are also provided. The semiconductor light emitting devices may have a direct current lifetime of at least 100 hours, at least 500 hours or at least 1000 hours.

42 Claims, 4 Drawing Sheets

(56) References Cited

U.S. PATENT DOCUMENTS

| | | |
|---|---|---|
| 5,294,833 A | 3/1994 | Schetzina |
| 5,351,255 A | 9/1994 | Schetzina |
| 5,366,927 A | 11/1994 | Schetzina |
| 5,393,993 A | 2/1995 | Edmond et al. |
| 5,409,859 A | 4/1995 | Glass et al. |
| 5,416,342 A | 5/1995 | Edmond et al. |
| 5,523,589 A | 6/1996 | Edmond et al. |
| 5,585,648 A | 12/1996 | Tischler |
| 5,592,501 A | 1/1997 | Edmond et al. |
| 5,661,074 A | 8/1997 | Tischler |
| 5,670,798 A | 9/1997 | Schetzina |
| 5,679,152 A | 10/1997 | Tischler et al. |
| 5,679,965 A | 10/1997 | Schetzina |
| 5,684,309 A * | 11/1997 | McIntosh et al. ............ 257/191 |
| 5,686,737 A | 11/1997 | Allen |
| 5,718,760 A | 2/1998 | Carter et al. |
| 5,724,062 A | 3/1998 | Hunter |
| 5,739,554 A | 4/1998 | Edmond et al. |
| 5,776,837 A | 7/1998 | Palmour |
| 5,777,350 A | 7/1998 | Nakamura et al. |
| 5,812,105 A | 9/1998 | Van de Ven |
| 5,818,072 A | 10/1998 | Schetzina |
| 5,838,706 A | 11/1998 | Edmond et al. |
| 5,874,747 A | 2/1999 | Redwing et al. |
| 5,912,477 A | 6/1999 | Negley |
| 5,917,196 A * | 6/1999 | Teraguchi ...................... 257/22 |
| 5,923,946 A | 7/1999 | Negley |
| 5,969,378 A | 10/1999 | Singh |
| 5,972,801 A | 10/1999 | Lipkin et al. |
| 6,011,279 A | 1/2000 | Singh et al. |
| 6,025,289 A | 2/2000 | Carter et al. |
| 6,046,464 A | 4/2000 | Schetzina |
| 6,051,849 A | 4/2000 | Davis et al. |
| 6,063,186 A | 5/2000 | Irvine et al. |
| 6,072,197 A * | 6/2000 | Horino et al. ................. 257/103 |
| 6,120,600 A | 9/2000 | Edmond et al. |
| 6,133,589 A | 10/2000 | Krames et al. |
| 6,150,672 A | 11/2000 | Kaneko |
| 6,153,010 A | 11/2000 | Kiyoku et al. |
| 6,153,894 A | 11/2000 | Udagawa |
| 6,156,581 A | 12/2000 | Vaudo et al. |
| 6,177,688 B1 | 1/2001 | Linthicum et al. |
| 6,187,606 B1 | 2/2001 | Edmond et al. |
| 6,200,917 B1 | 3/2001 | Carter et al. |
| 6,201,262 B1 | 3/2001 | Edmond et al. |
| 6,217,662 B1 | 4/2001 | Kong et al. |
| 6,218,680 B1 | 4/2001 | Carter, Jr. et al. |
| 6,238,945 B1 | 5/2001 | Kaneko |
| 6,246,076 B1 | 6/2001 | Lipkin et al. |
| 6,255,198 B1 | 7/2001 | Linthicum et al. |
| 6,261,929 B1 | 7/2001 | Gehrke et al. |
| 6,297,522 B1 | 10/2001 | Kordina et al. |
| 6,316,793 B1 | 11/2001 | Sheppard et al. |
| 6,337,493 B1 | 1/2002 | Tanizawa et al. |
| 6,359,292 B1 * | 3/2002 | Sugawara et al. ............ 257/103 |
| 6,373,077 B1 | 4/2002 | Edmond et al. |
| 6,373,188 B1 * | 4/2002 | Johnson et al. ............... 313/506 |
| 6,376,339 B2 | 4/2002 | Linthicum et al. |
| 6,380,108 B1 | 4/2002 | Linthicum et al. |
| 6,396,080 B2 | 5/2002 | Carter, Jr. et al. |
| 6,403,982 B2 | 6/2002 | Carter, Jr. et al. |
| 6,437,371 B2 | 8/2002 | Lipkin et al. |
| 6,459,100 B1 | 10/2002 | Doverspike et al. |
| 6,462,355 B1 | 10/2002 | Linthicum et al. |
| 6,475,889 B1 | 11/2002 | Ring |
| 6,486,042 B2 | 11/2002 | Gehrke et al. |
| 6,486,502 B1 | 11/2002 | Sheppard et al. |
| 6,489,221 B2 | 12/2002 | Gehrke et al. |
| 6,492,193 B1 | 12/2002 | Edmond et al. |
| 6,507,046 B2 | 1/2003 | Mueller |
| 6,515,303 B2 | 2/2003 | Ring |
| 6,521,514 B1 | 2/2003 | Gehrke et al. |
| 6,528,373 B2 | 3/2003 | Lipkin et al. |
| 6,530,990 B2 | 3/2003 | Kong et al. |
| 6,533,874 B1 * | 3/2003 | Vaudo et al. ................. 148/33.5 |
| 6,534,797 B1 | 3/2003 | Edmond et al. |
| 6,545,300 B2 | 4/2003 | Gehrke et al. |
| 6,570,192 B1 | 5/2003 | Davis et al. |
| 6,582,986 B2 | 6/2003 | Kong et al. |
| 6,583,454 B2 | 6/2003 | Sheppard et al. |
| 6,586,762 B2 | 7/2003 | Kozaki |
| 6,586,778 B2 | 7/2003 | Linthicum et al. |
| 6,602,763 B2 | 8/2003 | Davis et al. |
| 6,602,764 B2 | 8/2003 | Linthicum et al. |
| 6,608,327 B1 | 8/2003 | Davis et al. |
| 6,610,551 B1 | 8/2003 | Doverspike et al. |
| 6,621,148 B2 | 9/2003 | Linthicum et al. |
| 6,630,690 B2 | 10/2003 | Edmond et al. |
| 6,639,247 B2 | 10/2003 | Carter, Jr. et al. |
| 6,649,497 B2 | 11/2003 | Ring |
| 6,664,560 B2 | 12/2003 | Emerson et al. |
| 6,686,261 B2 | 2/2004 | Gehrke et al. |
| 6,717,185 B2 | 4/2004 | Edmond et al. |
| 6,734,033 B2 | 5/2004 | Emerson et al. |
| 6,764,932 B2 | 7/2004 | Kong et al. |
| 6,784,461 B2 | 8/2004 | Edmond et al. |
| 6,800,876 B2 | 10/2004 | Edmond et al. |
| 6,803,243 B2 | 10/2004 | Slater, Jr. et al. |
| 6,803,602 B2 | 10/2004 | Kong et al. |
| 6,812,053 B1 | 11/2004 | Kong et al. |
| 6,814,801 B2 | 11/2004 | Jenny et al. |
| 6,824,611 B1 | 11/2004 | Kordina et al. |
| 6,825,501 B2 | 11/2004 | Edmond et al. |
| 6,835,957 B2 * | 12/2004 | Stockman ........................ 257/79 |
| 6,849,874 B2 | 2/2005 | Sumakeris et al. |
| 6,884,644 B1 | 4/2005 | Slater, Jr. et al. |
| 6,903,446 B2 | 6/2005 | Tuttle et al. |
| 6,906,352 B2 | 6/2005 | Edmond et al. |
| 6,909,119 B2 | 6/2005 | Slater, Jr. et al. |
| 6,979,835 B1 * | 12/2005 | Yu et al. ......................... 257/22 |
| 2001/0028064 A1 * | 10/2001 | Hirayama et al. ............... 257/94 |
| 2001/0028668 A1 * | 10/2001 | Fukunaga et al. ............... 372/46 |
| 2001/0045564 A1 * | 11/2001 | Koike et al. ..................... 257/88 |
| 2002/0053676 A1 | 5/2002 | Kozaki |
| 2003/0001170 A1 * | 1/2003 | Shibata et al. ................. 257/189 |
| 2003/0006418 A1 | 1/2003 | Emerson et al. |
| 2003/0143771 A1 * | 7/2003 | Kidoguchi et al. .............. 438/46 |
| 2003/0205711 A1 * | 11/2003 | Tanizawa et al. ............... 257/79 |
| 2004/0021147 A1 * | 2/2004 | Ishibashi et al. ............... 257/103 |
| 2004/0056259 A1 * | 3/2004 | Goto et al. ...................... 257/79 |
| 2004/0089222 A1 * | 5/2004 | Motoki et al. ..................... 117/2 |
| 2004/0113169 A1 * | 6/2004 | Asami et al. ................... 257/103 |
| 2004/0137732 A1 * | 7/2004 | Frayssinet et al. ............. 438/689 |
| 2005/0040414 A1 * | 2/2005 | Hirayama et al. ............... 257/97 |
| 2005/0040425 A1 * | 2/2005 | Akita ............................ 257/103 |
| 2005/0151153 A1 * | 7/2005 | Kamikawa et al. ............ 257/103 |
| 2005/0211993 A1 * | 9/2005 | Sano et al. ....................... 257/79 |
| 2005/0236631 A1 * | 10/2005 | Lee .................................. 257/81 |
| 2005/0236633 A1 * | 10/2005 | Emerson ......................... 257/94 |
| 2005/0242364 A1 * | 11/2005 | Moustakas et al. ............ 257/103 |
| 2005/0264172 A1 * | 12/2005 | Wojnarowski et al. ........ 313/498 |
| 2006/0099781 A1 * | 5/2006 | Beaumont et al. ............. 438/509 |
| 2008/0042162 A1 * | 2/2008 | Hirayama et al. ............. 257/103 |
| 2008/0203418 A1 * | 8/2008 | Yanamoto ........................ 257/98 |

FOREIGN PATENT DOCUMENTS

| | | |
|---|---|---|
| JP | 7-162038 A | 6/1995 |
| JP | 7-176826 A | 7/1995 |
| JP | 8-023124 A | 1/1996 |
| JP | 8-070139 A | 3/1996 |
| JP | 8-162671 A | 6/1996 |
| JP | 8-274414 A | 10/1996 |
| JP | 8-330630 A | 12/1996 |
| JP | 9-148678 A | 6/1997 |
| JP | 9-153642 A | 6/1997 |
| JP | 9-162444 A | 6/1997 |
| JP | 9-219556 A | 8/1997 |
| JP | 10-12969 A | 1/1998 |
| JP | 10-41581 A | 2/1998 |
| JP | 10-145000 A | 5/1998 |
| JP | 10-145002 A | 5/1998 |
| JP | 10-283846 | * 10/1998 |
| JP | 11-40850 A | 2/1999 |

(56) References Cited

FOREIGN PATENT DOCUMENTS

| JP | 11-74562 | A | | 3/1999 |
|---|---|---|---|---|
| JP | 11-186659 | A | | 7/1999 |
| JP | 11-191638 | A | | 7/1999 |
| JP | 11-224972 | A | | 8/1999 |
| JP | 11-238945 | A | | 8/1999 |
| JP | 11-251684 | A | | 9/1999 |
| JP | 11-298090 | A | | 10/1999 |
| JP | 2000-68594 | A | | 3/2000 |
| JP | 2000-133883 | A | | 5/2000 |
| JP | 2000-150956 | A | | 5/2000 |
| JP | 2000-244072 | A | | 9/2000 |
| JP | 2000-307149 | A | | 11/2000 |
| JP | 2002-43233 | | * | 2/2002 |
| JP | 2003-7627 | | * | 1/2003 |
| JP | 2005-101533 | | * | 4/2005 |
| WO | WO 98/31055 | A1 | | 7/1998 |
| WO | 99/05728 | A1 | | 2/1999 |
| WO | WO 99/46822 | A1 | | 9/1999 |
| WO | WO 00/21143 | A1 | | 4/2000 |
| WO | WO 00/76004 | A1 | | 12/2000 |
| WO | WO 02/05399 | A1 | | 1/2002 |

OTHER PUBLICATIONS

Chitnis et al., "Milliwatt power AlGaN quantum well deep ultraviolet light emitting diodes" *Phys. Stat. So(A)* 200(1):99-101 (2003).

Edmond et al., "High Efficiency GaN Based LEDs and Lasers for Blue to UV Optoelectronics" (Abstract), The Twelfth International Conference on Metal Organic Vapor Phase Epitaxy, May 30-Jun. 4, 2004, Lahaina, Maui, Hawaii, p. 18.

Edmond et al., "High Efficiency GaN-based LEDs and lasers on SiC" *Journal of Crystal Growth*, 272:242-250 (2004).

LeBoeuf, et al., "Development of Ultraviolet III-Nitride LEDs", Presentation at ECS 2003.

Nichia Corporation "Specifications for Nichia UV LED Model: NSHU590A", No. STSE-CH2058C <Cat No. 040206> (no date).

Nichia Corporation "Specifications for Nichia UV LED Model: NSHU550A", No. STSE-CH2056C <Cat No. 040206> (no. date).

Nichia Corporation "Specifications for Nichia UV LED Model: NSHU590B", No. STSE-CH4023A <Cat No. 040423> (no. date).

Nichia Corporation "Specifications for Nichia UV LED Model: NSHU550B", No. STSE-CH4021A <Cat No. 040526> (no. date).

Notification of Transmittal of the International Search Report and the Written Opinion of the International Searching Authority, or the Declaration, Written Opinion of the International Searching Authority and International Search Report, PCT/US2006/019951, Oct. 20, 2006.

Notification of Transmittal of the International Search Report or the Declaration and International Search Report, PCT/US02/16407, Nov. 13, 2002.

Shatalov et al. "Deep Ultraviolet Light-Emitting Diodes Using Quaternary AlInGaN Multiple Quantum Wells" *IEEE Journal on Selected Topics in Quantum Electronics*, 8(2):302-309 (2002).

Wu et al. "Micro-pixel Design Milliwatt Power 254 nm Emission Light Emitting Diodes" *Japanese Journal of Applied Physics*, 43(8A):L1035-L1037 (2004).

Xin et al. "Electrical and Optical Characteristics of Delta Doped AlGaN Cladding Layer Materials for Highly Efficient 340nm Ultra Violet LEDs" *Mat. Res. Soc. Symp. Proc.*, 798:Y3.10.1-Y3.10.6 (2004).

Yasan et al. "4.5 mW operation of AlGaN-based 267 nm deep-ultraviolet light-emitting diodes" *Applied Physics Letters* 83(23):4701-4703 (2003).

Yasan et al. "Comparison of ultraviolet light-emitting diodes with peak emission at 340 nm grown on GaN substrate and sapphire" *Applied Physics Letters* 81(12):2151-2153 (2002).

Yasan et al. "Photoluminescence Study of AlGaN-based 280 nm ultraviolet light-emitting diodes" *Applied Physics Letters* 83(20):4083-4085 (2003).

Yasan et al. "Top-emission ultraviolet-emitting diodes with peak emission at 280 nm" *Applied Physics Letters* 81(5):801-802 (2002).

Zhang et al. "Milliwatt power deep ultraviolet light-emitting diodes over sapphire with emission at 278 nm" *Applied Physics Letters* 81(26):4910-4912 (2002).

* cited by examiner

DEEP ULTRAVIOLET LIGHT EMITTING DEVICES AND METHODS OF FABRICATING DEEP ULTRAVIOLET LIGHT EMITTING DEVICES

CROSS-REFERENCE TO RELATED APPLICATION

This application is a divisional of U.S. application Ser. No. 11/140,384, filed May 27, 2005, now abandoned entitled Deep Ultraviolet Light Emitting Devices and Methods of Fabricating Deep Ultraviolet Light Emitting Devices, the disclosure of which is hereby incorporated herein by reference in its entirety as if set forth fully herein.

FIELD OF THE INVENTION

This invention relates to semiconductor light emitting devices and methods of fabricating light emitting devices.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to emit coherent and/or incoherent light upon energization thereof. In particular, a light emitting diode or laser diode, generally includes an active region on a microelectronic substrate. The microelectronic substrate may be, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps. Recently, applications for LEDs emitting in the deep UV (DUV) region of the spectrum (less than roughly 375 nm) have been identified. These applications include chemical and biological agent detection systems, non-line-of-site communication systems, water and air purification systems and/or tanning applications.

Much development interest and commercial activity recently has focused on LEDs that are fabricated in or on silicon carbide, because these LEDs can emit radiation in the blue/green portions of the visible spectrum. See, for example, U.S. Pat. No. 5,416,342 to Edmond et al., entitled BLUE LIGHT-EMITTING DIODE WITH HIGH EXTERNAL QUANTUM EFFICIENCY, assigned to the assignee of the present application, the disclosure of which is hereby incorporated herein by reference in its entirety as if set forth fully herein. There also has been much interest in LEDs that include gallium nitride-based diode regions on silicon carbide substrates, because these devices also may emit light with high efficiency. See, for example, U.S. Pat. No. 6,177,688 to Linthicum et al., entitled PENDEOEPITAXIAL GALLIUM NITRIDE SEMICONDUCTOR LAYERS ON SILICON CARBIDE SUBSTRATES, the disclosure of which is hereby incorporated herein by reference in its entirety as if set forth fully herein.

Ultraviolet light emitting devices have also been described, for example, in U.S. Pat. No. 6,734,033 to Emerson et al. entitled ULTRAVIOLET LIGHT EMITTING DIODE; U.S. Pat. No. 6,664,560 to Emerson et al. entitled ULTRAVIOLET LIGHT EMITTING DIODE; U.S. Pat. No. 5,661,074 to Tischler entitled HIGH BRIGHTNESS ELECTROLUMINESCENT DEVICE EMITTING IN THE GREEN TO ULTRAVIOLET SPECTRUM AND METHOD OF MAKING THE SAME; U.S. Pat. No. 5,874,747 to Redwing et al. entitled HIGH BRIGHTNESS ELECTROLUMINESCENT DEVICE EMITTING IN THE GREEN TO ULTRAVIOLET SPECTRUM AND METHOD OF MAKING THE SAME; and U.S. Pat. No. 5,585,648 to Tischler entitled HIGH BRIGHTNESS ELECTROLUMINESCENT DEVICE, EMITTING IN THE GREEN TO ULTRAVIOLET SPECTRUM, AND METHOD OF MAKING THE SAME, the disclosures of which are incorporated herein as if set forth fully herein.

Others have produced relatively high efficiency LEDs in the DUV region of the spectrum. For example, Nichia Corporation has announced the development of light emitting diodes having outputs of 365 nm and 375 nm. See Nichia product specifications, NSHU550A, NSHU590A, NSHU550B and NSHU590B. However, to date high efficiency DUV LEDs with emission wavelengths less than approximately 360 nm have not been achieved due to several fundamental technical challenges including the following: output power too low for a given drive current, wallplug efficiency too low, and device lifetime too low.

SUMMARY OF THE INVENTION

Some embodiments of the present invention provide light emitting devices and methods of fabricating light emitting devices that emit at wavelengths less than 360 nm with wall plug efficiencies of at least than 4%. In other embodiments, the wall plug efficiencies are at least 5%. In further embodiments, the wall plug efficiencies are at least 6%. Additionally, the semiconductor light emitting devices may have a direct current lifetime of at least 100 hours, at least 500 hours or at least 1000 hours.

In further embodiments, the light emitting devices emit at wavelengths less than 345 nm with wall plug efficiencies of at least 2%. In other embodiments, the wall plug efficiencies of devices emitting in this wavelength range are at least 3%. In further embodiments, the wall plug efficiencies are at least 4%. Additionally, the semiconductor light emitting devices may have a direct current lifetime of at least 100 hours, at least 500 hours or at least 1000 hours.

In still further embodiments, the light emitting devices emit at wavelengths less than 330 nm with wall plug efficiencies of at least 0.4%. Additionally, the semiconductor light emitting devices may have a direct current lifetime of at least 100 hours, at least 500 hours or at least 1000 hours.

In particular embodiments of the present invention, the light emitting devices have a peak output wavelength of 345 nm or less and a wall plug efficiency of at least 4% at a current density of less than $0.35\ \mu A/\mu m^2$ and/or a wall plug efficiency of at least 6% at a current density of less than $0.08\ \mu A/\mu m^2$.

Further embodiments of the present invention provide light emitting devices and methods of fabricating light emitting devices having a peak output wavelength of not greater than 360 nm and provides a radiant output of at least about 0.047 $\mu W/\mu m^2$ normalized to chip size. In some embodiments, the peak output wavelength is 345 nm or less. In such embodiments, the light emitting device may have a wall plug efficiency of at least 3% or even a wall plug efficiency of at least 6%. In some embodiments, the peak output wavelength is 320 nm or less.

Some embodiments of the present invention provide light emitting devices and methods of fabricating light emitting devices that include a low defect density base structure comprising an n-type SiC substrate and a GaN layer doped with n-type dopants. A quantum well active region is provided on the low defect density base structure that emits light at a wavelength of less than 360 nm. The quantum well active region comprises a GaN, AlGaN or AlInGaN layer and a doped AlGaN barrier layer. An AlGaN layer is provided on the quantum well active region and a GaN based contact layer is provided on the AlGaN layer. The doped GaN layer may be a doped GaN layer having a defect density of less than about $4 \times 10^8$ cm$^{-2}$. The GaN layer doped with n-type dopants may comprise GaN doped with silicon. The AlGaN layer on the quantum well active region may comprise an AlGaN layer doped with a p-type dopant on the quantum well active region and the GaN based contact layer on the AlGaN layer may comprise a GaN based contact layer doped with a p-type dopant. The p-type dopant may comprise Mg. The barrier layer may be doped with Si.

In further embodiments, the quantum well active region comprises ten quantum well layers and eleven barrier layers with the quantum well layers being disposed between adjacent barrier layers. In other embodiments, the quantum well active region comprises five quantum well layers and six barrier layers with the quantum well layers being disposed between adjacent barrier layers. The light emitting device may have an overall thickness of less than about 2.5 μm. In further embodiments, the device may have an overall thickness of less than 2.0 μm or even 1.0 μm.

Some embodiments of the present invention provide light emitting devices and methods of fabricating light emitting devices that include a quantum well active region on the doped GaN layer. The quantum well active region is configured to emit at a peak output wavelength of not greater than 360 nm and comprises a barrier layer comprising $Al_wIn_xGa_{1-x-w}N$, where $0<w\leq1$, $0\leq x<1$ and $0<w+x\leq1$ and where w and x provide a barrier energy greater than a bandgap energy of GaN or within about 1 eV of the bandgap energy of GaN and a well layer comprising $Al_yIn_zGa_{1-y-z}N$ on the barrier layer, where $0\leq y<1$, $0\leq z<1$ and $0\leq y+z<1$.

Further embodiments of the present invention include a buffer structure with a defect density of not greater than $4\times10^8$ cm$^{-2}$. In some embodiments, this buffer structure comprises a GaN layer doped with an n-type dopant and a quantum well active region is provided on the GaN layer doped with an n-type dopant.

Additional embodiments of the present invention include a semiconductor substrate and the quantum well active region is provided on the semiconductor substrate. The semiconductor substrate may be conducting or insulating. In some embodiments, the semiconductor substrate comprises SiC or GaN. In other embodiments, the semiconductor substrate comprises sapphire.

In further embodiments, a first layer of $Al_pGa_{1-p}N$ doped with a p-type dopant may be provided on the quantum well active region where $0<p\leq0.8$ and a second layer of $Al_qGa_{1-q}N$ doped with a p-type dopant is provided on the first layer, where $0\leq q<p$.

In particular embodiments of the present invention, the barrier layer is doped with the n-type dopant. The n-type dopant may be Si. The p-type dopant may be Mg. The barrier layer may have a thickness of from about 10 Å to about 100 Å and the well layer may have a thickness of from about 10 Å to about 30 Å. The first layer may have a thickness of about 50 Å and the second layer may have a thickness of about 300 Å.

In further embodiments of the present invention, the barrier layer comprises $Al_wIn_xGa_{1-x-w}N$, where $0.2<w\leq0.8$, $0\leq x<0.2$ and $0.2<w+x\leq1$ and has a thickness of from about 10 Å to about 50 Å, the well layer comprises $Al_yIn_zGa_{1-y-z}N$ on the barrier layer, where $0\leq y<0.4$, $0\leq z<0.1$ and $0\leq y+z<0.4$ and has a thickness of from about 10 Å to about 30 Å, the first layer comprises $Al_pGa_{1-p}N$ doped with a p-type dopant on the quantum well active region where $0.3<p\leq0.8$ and has a thickness of from about 50 Å to about 250 Å, the second layer comprises $Al_qGa_{1-q}N$ doped with a p-type dopant on the first layer, where $0\leq q<p$ and the second layer has a thickness of from about 200 Å to about 600 Å, the quantum well active region comprises from about 3 to about 12 quantum wells of the well layer and corresponding barrier layers and a peak output wavelength of the light emitting device is not greater than 360 nm.

In additional embodiments of the present invention, the barrier layer comprises $Al_wIn_xGa_{1-x-w}N$, where $0.3<w\leq0.8$, $0\leq x<0.2$ and $0.3<w+x\leq1$ and has a thickness of from about 10 Å to about 50 Å, the well layer comprises $Al_yIn_zGa_{1-y-z}N$ on the barrier layer, where $0\leq y<0.4$, $0\leq z<0.1$ and $0\leq y+z<0.5$ and has a thickness of from about 10 Å to about 30 Å, the first layer comprises $Al_pGa_{1-p}N$ doped with a p-type dopant on the quantum well active region where $0.3<p\leq0.8$ and has a thickness of from about 50 Å to about 250 Å, the second layer comprises $Al_qGa_{1-q}N$ doped with a p-type dopant on the first layer, where $0\leq q<p$ and the second layer has a thickness of from about 200 Å to about 600 Å, the quantum well active region comprises from about 3 to about 12 quantum wells of the well layer and corresponding barrier layers and a peak output wavelength of the light emitting device is not greater than 330 nm.

In still further embodiments of the present invention, the well layer comprises $Al_wIn_xGa_{1-x-w}N$, where w=0, x=0 and has a thickness of 15 Å, the barrier layer comprises $Al_yIn_zGa_{1-y-z}N$ doped with silicon on the barrier layer, where y=0.3, z=0 and has a thickness of 35 Å, the first layer comprises $Al_pGa_{1-p}N$ doped with Mg on the quantum well active region where p=0.5 and has a thickness of 85 Å, the second layer comprises $Al_qGa_{1-q}N$ doped with Mg on the first layer, where q=0 and the second layer has a thickness of 300 Å, the quantum well active region comprises ten quantum wells of the well layer and corresponding barrier layers and a peak output wavelength of the light emitting device is approximately 340 nm.

In still further embodiments of the present invention, the well layer comprises $Al_wIn_xGa_{1-x-w}N$, where w=0.3, x=0 and has a thickness of 15 Å, the barrier layer comprises $Al_yIn_zGa_{1-y-z}N$ doped with silicon on the barrier layer, where y=0.5, z=0 and has a thickness of 20 Å, the first layer comprises $Al_pGa_{1-p}N$ doped with Mg on the quantum well active region where p=0.5 and has a thickness of 230 Å, the second layer comprises $Al_qGa_{1-q}N$ doped with Mg on the first layer, where q=0 and the second layer has a thickness of 300 Å, the quantum well active region comprises ten quantum wells of the well layer and corresponding barrier layers and a peak output wavelength of the light emitting device is approximately 325 nm.

DETAILED DESCRIPTION

Figure 1:
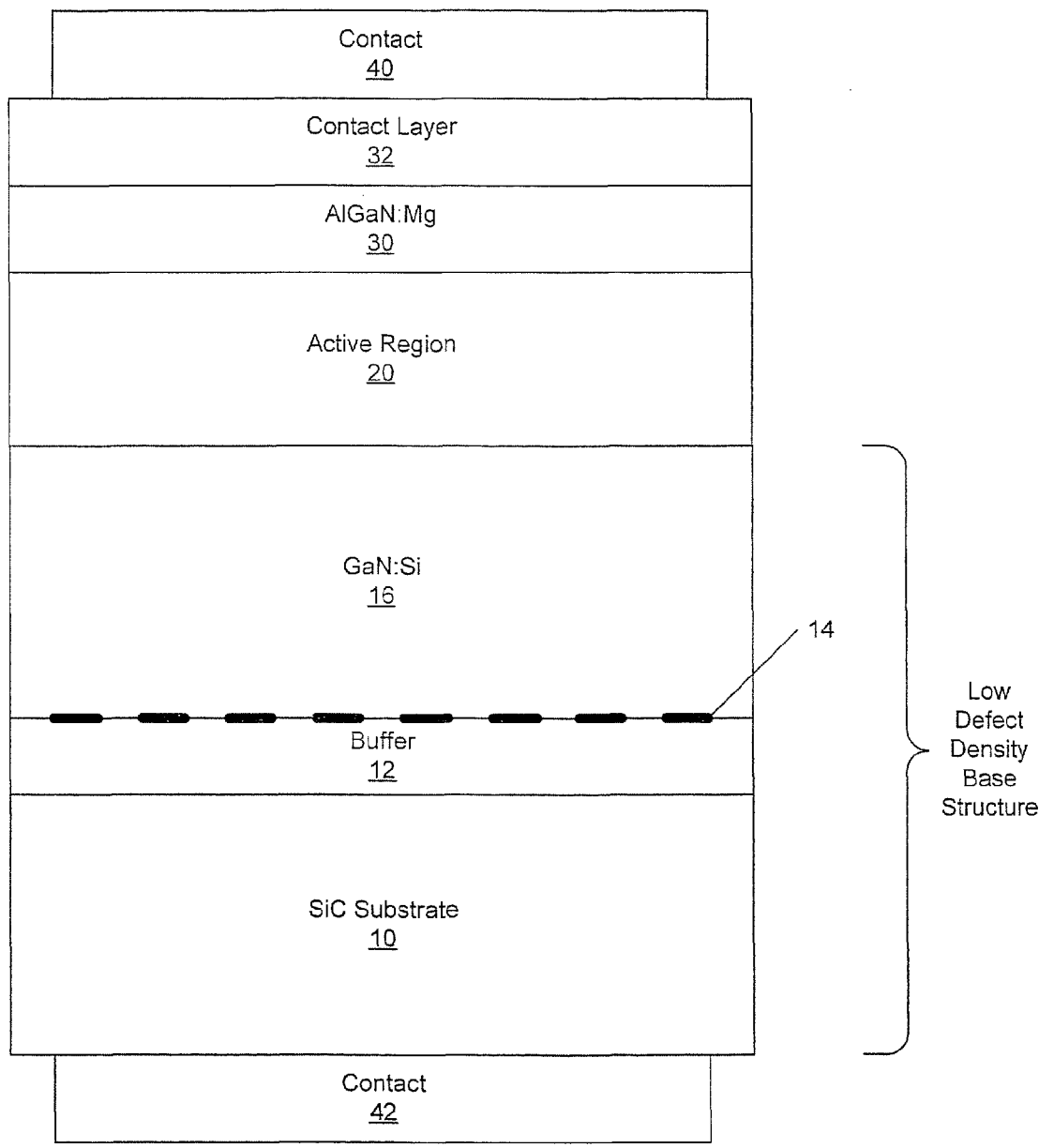
FIG. 1 is a cross-sectional view illustrating deep ultraviolet semiconductor light emitting devices according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Although various embodiments of LEDs disclosed herein include a substrate, it will be understood by those skilled in the art that the epitaxial growth substrate on which the epitaxial layers comprising an LED are grown may be removed, and the freestanding epitaxial layers may be mounted on a substitute carrier substrate or submount which may have different thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

Some embodiments of the present invention may provide for deep ultraviolet light emitting devices having an active region formed on a low defect density base structure as described herein. As used herein, unless specified otherwise, deep ultraviolet refers to a peak output wavelength of not greater than 360 nm. Further embodiments of the present invention provide for deep ultraviolet light emitting devices having improved wall plug efficiency. Wall plug efficiency refers to the ratio of output power to input power. Additionally, some embodiments of the present invention provide deep ultraviolet light emitting devices having improved direct current lifetimes. Direct current lifetime refers to the time it takes for the output power of the device to degrade 50% in continuous wave operation or the equivalent of continuous wave operation. For example, if pulsed operation is utilized, the direct current lifetime is the total time that the device is active and does not include the time when the device is inactive. Still other embodiments of the present invention provide deep ultraviolet light emitting devices that support a high current density.

Embodiments of the present invention may be particularly well suited for use in nitride-based light emitting devices such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ may be used to describe them. Furthermore, references to a GaN based material refers to a material that includes GaN and may include binary, ternary, quaternary or other materials that include GaN.

Light emitting devices according to some embodiments of the present invention may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide gallium nitride and/or other microelectronic substrates, and one or more contact layers which may include metal and/or other conductive layers. In some embodiments, deep ultraviolet light emitting devices, such as LEDs, having a peak output wavelength of not greater than 360 nm are provided. In some embodiments, deep ultraviolet light emitting devices, such as LEDs, having a peak output wavelength of not greater than 345 nm are provided. In further embodiments of the present invention, deep ultraviolet light emitting devices, such as LEDs, having a peak output wavelength of not greater than 330 nm are provided.

In particular embodiments of the present invention, light emitting devices are provided that have a peak output wavelength of not greater than 360 nm and a wall plug efficiency of greater than 4% and in some embodiments, greater than 5% and in others greater than 6% where in all cases the current density is less than 0.35 $\mu A/\mu m^2$. Some embodiments of the present invention provide light emitting devices that have a peak output wavelength of 345 nm or less and a wall plug efficiency of greater than 2% or greater than 3% or greater than 4% where in all cases the current density is less than 0.35 $\mu A/\mu m2$. In other embodiments, the wallplug efficiency is greater than 6% when the current density is less than 0.08 $\mu A/\mu m^2$. Some embodiments of the present invention provide light emitting devices that have a peak output wavelength of 330 nm or less and a wall plug efficiency of at least 0.4% when the current density is less than 0.35 $\mu A/\mu m^2$.

In particular embodiments of the present invention, light emitting devices are provided that have a peak output wavelength of not greater than 360 nm and an output power of at least 5 mW at a current density of less than roughly 0.35 $\mu A/\mu m^2$. Some embodiments of the present invention provide light emitting devices that have a peak output wavelength of 345 nm or less and an output power of at least 3 mW at a current density of less than about 0.35 $\mu A/\mu m^2$. In other embodiments of the present invention provide light emitting devices that have a peak output wavelength of 330 nm or less and an output power of at least 0.3 mW at a current density of less than about 0.35 $\mu A/\mu m^2$.

As used herein, current density refers the current per unit area. Such unit area may correspond to an area of the light emitting device and the per unit area measurement refers to the average current density in the area of the light emitting device. Thus, for example, particular regions of the device may have a higher than average current density while other regions of the device have a lower than average current density.

Unless otherwise specified, characterizations of the performance of light emitting devices that may apply to arrays of chips or single chips are provided herein with reference to a single chip as opposed to an array of chips. Thus, for example, the output power of 3 mW is the output power of a single chip, not an array of chips.

Some embodiments of the present invention incorporate an active region on a low defect density base structure. As used herein, a base structure refers to a structure on which the active region is formed. A low defect density base structure refers to a base structure having a layer on which the active region is formed that has a defect density of less than about $4 \times 10^8$ $cm^{-2}$. As used herein, the term defect density refers to a number of threading dislocations per unit area. Such unit area may correspond to an area of the light emitting device and the per unit area measurement refers to the average number of defects in the area of the light emitting device. Thus, for example, particular regions of the device may have a higher than average number of defects while other regions of the device have a lower than average number of defects. Measurement of dislocation density may be made using conventional defect measurement techniques, such as those used in measuring threading dislocation defects in Group III nitride materials. Such techniques may include, for example, etching and optical imaging and/or atomic force microscopy. Following etching or polishing, small diameter, shallow pits are formed at the site of threading dislocations and are readily observed by atomic force microscopy. The threading dislocation density is sampled and the average value used to characterize the threading dislocation defect density.

In particular embodiments of the present invention, light emitting devices are provided that have a peak output wavelength of not greater than 360 nm and a direct current lifetime of greater than 100 hours, in some embodiments greater than 500 hours and in some embodiments, greater than 1000 hours. Some embodiments of the present invention provide light emitting devices that have a peak output wavelength of 345 nm or less and a direct current lifetime of greater than 100 hours, in some embodiments greater than 500 hours and in some embodiments, greater than 1000 hours. Some embodiments of the present invention provide light emitting devices that have a peak output wavelength of 330 nm or less and a direct current lifetime of greater than 100 hours, in some embodiments greater than 500 hours and in some embodiments, greater than 1000 hours.

FIG. 1 illustrates a light emitting device, such as a light emitting diode, according to some embodiments of the present invention. As seen in FIG. 1, an n-type SiC substrate 10 has an optional buffer layer 12 disposed on a first surface of the substrate 10. The SiC substrate may be a substrate such as available from Cree, Inc., Durham, N.C. Techniques for fabricating SiC substrates are known to those of skill in the art and, therefore, need not be described further herein. For example, methods for producing SiC substrates are described, for example, in U.S. Pat. Nos. Re. 34,861; 4,946, 547; 6,706,114, the contents of which are incorporated herein by reference in their entirety. In particular embodiments of the present invention, the SiC substrate may be 6H or 4H polytypes of SiC. While exemplary embodiments of the present invention are described with reference to a conductive SiC substrate, other substrates may be used, such as a conductive GaN substrate. Also, insulating substrates, such as sapphire and/or insulating or semi-insulating SiC or GaN, could also be utilized with a lateral device structure.

The buffer layer 12 may be an AlGaN or other suitable buffer layer capable of providing for growth of a low defect density Group III nitride layer on the buffer layer 12. In some embodiments, the buffer layer 12 may, optionally, include gallium nitride dots (not shown) on the surface of the silicon carbide substrate, with the dots in turn being covered with AlGaN caps. Thus, the buffer layer 12 can also be described as being on the dots and their caps. Such a structure and method of fabricating such structures are described in U.S. Pat. Nos. 6,734,033 and 6,664,560, the disclosures of which are incorporated herein as if set forth in their entirety. Exemplary buffer structures and compositions are also set forth in U.S. Pat. Nos. 5,393,993 and 5,523,589, the disclosures of which are incorporated herein as if set forth in their entirety.

As is further illustrated in FIG. 1, the buffer layer 12 may include optional mask regions 14 that may, for example, be a SiN layer and a Group III nitride layer 16, such as a GaN layer doped with Si, formed on the buffer layer and the mask regions 14. The SiN may be stoichiometric or non-stoichiometric. The inclusion of the SiN layer 14 may provide for epitaxial lateral overgrowth of the Group III nitride layer 16 to thereby reduce the defect density of the Group III nitride layer 16. Other techniques for growing a Group III nitride layer, such as a GaN layer, may also be utilized, such as cantilevered or pendeo-epitaxial growth. Techniques for cantilevered growth, pendeo-epitaxial growth and/or epitaxial lateral overgrowth are known to those of skill in the art and need not be described further herein. However, examples of such growth are described, for example, in U.S. Pat. Nos. 6,582,986, 6,686,261, 6,621,148, 6,608,327, 6,602,764, 6,602,763, 6,586,778, 6,582,986, 6,570,192, 6,545,300, 6,521,514, 6,489,221, 6,486,042, 6,462,355, 6,380,108, 6,376,339, 6,261,929, 6,255,198, 6,177,688 and 6,051,849, the disclosures of which are incorporated herein by reference as if set forth fully herein. Similarly, other techniques for epitaxial growth of Group III nitrides which may be suitable for use in some embodiments of the present invention have been described in, for example, U.S. Pat. Nos. 5,210,051; 5,393, 993; 5,523,589; and 5,592,501, the contents of which are also incorporated herein by reference in their entirety.

As briefly discussed above, a Group III nitride layer 16 is provided on the buffer layer 12. In particular embodiments of the present invention, the Group III nitride layer is doped with n-type dopants, such as Si. In further embodiments of the present invention, the Group III nitride layer is GaN doped with Si. The Group III nitride layer 16 may be a low defect density layer as discussed above and having a defect density of $4 \times 10^8$ cm$^{-2}$ or less. In some embodiments of the present invention, the Group III nitride layer 16 has a thickness of from about 0.8 μm to about 2.0 μm. In particular embodiments of the present, the substrate 10, buffer layer 12 and/or Group III nitride layer 16 are absorbing in the wavelength range of the output of the light emitting device.

A quantum well active region 20 is provided on the Group III nitride layer 16. The quantum well active region 20 may include one or more quantum well structures where the barrier layers of the quantum well structures have a barrier energy of greater than the bandgap of GaN or near the bandgap energy of GaN, such as within about 1 eV of the bandgap energy of GaN. In particular embodiments of the present invention, the quantum well active region 20 includes from 3 to 12 quantum wells. The thickness and composition of the well layers may be selected so as to provide a desired output wavelength. Furthermore, changes in composition of the well layer may be offset by changes in the thickness of the well layer. For example, to provide an output wavelength of 340 nm, GaN well layer having a thickness of about 15 Å may be utilized, whereas to provide an output wavelength of 320 mm, an AlGaN well layer may be utilized. Thus, to select the characteristics of the quantum well and barrier layers, the thickness and composition of the barrier and well layers may be selected so as to provide optimized performance. This may include balancing sufficient composition to provide carrier confinement for the emission wavelength while maintaining performance. This may also include optimizing thickness to provide sufficient carrier confinement while minimizing stress (strain) in the film, which in turn minimizes cracking in the epitaxial layers. Particular structures of the quantum well active region 20 are described in further detail below.

Figure 2:
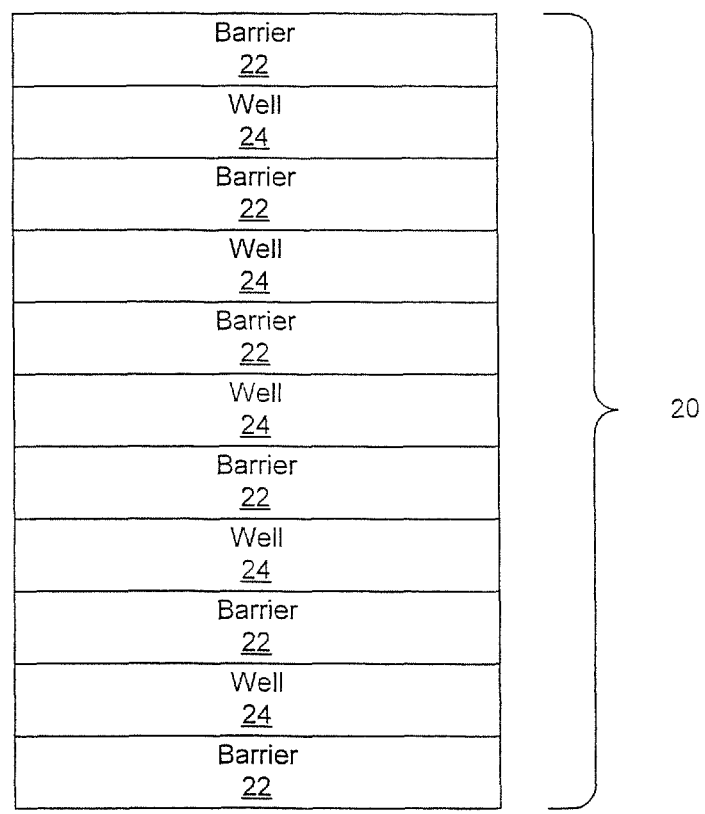
FIG. 2 is a detailed view of an active region of deep ultraviolet semiconductor light emitting devices according to some embodiments of the present invention.

FIG. 2 is a more detailed view of a quantum well active region 20 according to some embodiments of the present invention. While FIG. 2 is illustrated as having five quantum well structures, other numbers of quantum well structures as described herein may be provided. As seen in FIG. 2, the quantum well structures include a barrier layer 22 and a well layer 24 with multiple repetitions of each. The well layers 24 are each disposed between two opposing barrier layers 22. Thus, for n well layers 24, n+1 barrier layers 22 may be provided. Furthermore, a barrier layer 22 may be provided as one or more layers as described, for example, in United States Patent Publication No. 2003/0006418 entitled GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES, the disclosure of which is incorporated herein as if set forth in its entirety. The barrier layers 22 and the well layers 24 may be fabricated using conventional Group III nitride growth techniques such as those discussed above. In particular embodiments of the present invention, the barrier layer 22 has a thickness of from about 10 Å to about 100 Å and the well layer 24 has a thickness of from about 10 Å to about 30 Å.

Returning to FIG. 1, an AlGaN layer 30 doped with p-type dopants is provided on the quantum well active region 20. In particular embodiments of the present invention, the AlGaN layer 30 may be doped with Mg. In further embodiments of the present invention, the AlGaN layer 30 may have an aluminum percentage of from about 40% to about 60%. Furthermore, the AlGaN layer 30 may have a thickness of from about 50 Å to about 250 Å.

A contact layer 32 may also be provided on the AlGaN layer 30. The contact layer 32 may be a GaN based layer and may have a lower percentage of Al than the AlGaN layer 30. The contact layer 32 may be doped with a p-type dopant, such as Mg, and may have a thickness of from about 200 Å to about 600 Å. The AlGaN layer 30 and the contact layer 32 may be fabricated using conventional. Group III nitride growth techniques such as those discussed above.

As is further illustrated in FIG. 1, an ohmic contact 40 may be provided on the contact layer 32 and an ohmic contact 42 may be provided on a second surface of the substrate 10 opposite the first surface. The contact 40 may be a platinum contact. Other materials may be used for the ohmic contact 40. For example, the ohmic contact may comprise rhodium, zinc oxide, palladium, palladium oxide, titanium, nickel/gold, nickel oxide/gold, nickel oxide/platinum and/or titanium/gold. In some embodiments, the ohmic contact has an average thickness less than 50 Å. In some embodiments, the ohmic contact has an average thickness less than 25 Å, and in further embodiments, the ohmic contact has an average thickness less than 15 Å. In still further embodiments, the ohmic contact has an average thickness of about 10 Å. In further embodiments, the ohmic contact has an average thickness of 5 Å or less, 3 Å or less or even about 1 Å.

The ohmic contact 40 may be formed by electron beam (e-beam) evaporation or any other suitable techniques for controllably forming atomically thin metallic films. For example, it may be possible to form the ohmic contacts by electroplating provided adequate process control is maintained. In electron beam evaporation, a metal source target is heated in a vacuum chamber to the point of vaporization by a high intensity electron beam which melts a region of the target. An epitaxial wafer placed within the chamber is controllably coated with vaporized metal. E-beam evaporation and other film deposition methods are described in Chapter 6 of INTRODUCTION TO MICROELECTRONIC FABRICATION by R. Jaeger (2nd Ed. 2002).

The deposition rate of the process may be controlled by changing the current and energy of the electron beam. In some embodiments, the deposition rate is maintained at a low rate, e.g. in the range of 0.1-0.5 Å per second in order to maintain adequate control of film thickness. In addition, the film deposition may be controlled during deposition by monitoring the transmission properties of a witness slide on which the ohmic metal film is simultaneously deposited. The witness slide may be sapphire, quartz, or any other optically transmissive material on which a metal film may be deposited. The transmission sensitivity to the metal thickness is dependent upon the wavelength of the light used in the monitoring process. Namely, the transmission sensitivity is enhanced at shorter wavelengths. Accordingly, in some embodiments, the transmission properties of a sapphire witness slide are measured during or after film deposition by means of a monitoring system employing a UV source capable of emitting light at wavelengths of 350 nm or less, such as a UV spectrophotometer.

The contact 42 may be any suitable material for forming an ohmic contact to the n-type SiC substrate 10. For example, in embodiments where the substrate is SiC, the ohmic contact 42 may be nickel or other suitable material. Furthermore, because the substrate 10 may be absorbing at the output wavelength of the device, the contact 42 need not be transparent or reflecting. Thus, any suitable technique for forming an ohmic contact to the substrate 10 may be utilized. Such techniques are known to those of skill in the art and, therefore, need not be described further herein.

Particular embodiments of the present invention will now we described with reference to particular compositions and dimensions of the various layers of the light emitting devices illustrated in FIGS. 1 and 2.

In some embodiments of the present invention that provide light emitting devices having a peak output wavelength of not greater than 360 nm, the barrier layer 22 comprises $Al_wIn_xGa_{1-x-w}N$, where $0.2<w\leq0.8$, $0\leq x<0.2$ and $0.2<w+x\leq1$ and has a thickness of about 10 Å to 60 Å. The well layer 24 comprises $Al_yIn_zGa_{1-y-z}N$ on the barrier layer, where $0\leq y<0.4$, $0\leq z<0.1$ and $0\leq y+z<0.5$ and has a thickness of from about 10 Å to about 30 Å. The AlGaN layer 30 comprises $Al_pGa_{1-p}N$ doped with a p-type dopant on the quantum well active region where $0.3<p\leq0.8$ and has a thickness of from about 50 Å to about 250 Å and the contact layer 32 comprises $Al_qGa_{1-q}N$ doped with a p-type dopant on the AlGaN layer 30, where $0\leq q<p$ and the contact layer 32 has a thickness of from about 200 Å to about 600 Å. The quantum well active region 20 comprises from about 3 to about 12 quantum wells of the well layer 24 and corresponding barrier layers 22.

In some embodiments of the present invention that provide light emitting devices having a peak output wavelength of not greater than 345 nm, the barrier layer 22 comprises $Al_wIn_xGa_{1-x-w}N$, where $0.2<w\leq0.8$, $0\leq x<0.2$ and $0.2<w+x\leq1$ and has a thickness of from about 10 Å to about 60 Å and the well layer 24 comprises $Al_yIn_zGa_{1-y-z}N$ on the barrier layer, where $y=0$ and $z=0$ and has a thickness of from about 10 Å to about 30 Å. The AlGaN layer 30 comprises $Al_pGa_{1-p}N$ doped with a p-type dopant on the quantum well active region where $0.3<p\leq0.8$ and has a thickness of from about 50 Å to about 250 Å and the contact layer 32 comprises $Al_qGa_{1-q}N$ doped with a p-type dopant on the AlGaN layer 30, where $0\leq q<p$ and the contact layer 32 has a thickness of from about 200 Å to about 600 Å. The quantum well active region 20 comprises from about 3 to about 12 quantum wells of the well layer 24 and corresponding barrier layers 22.

In some embodiments of the present invention that provide light emitting devices having a peak output wavelength of not greater than 330 nm, the barrier layer 22 comprises $Al_wIn_xGa_{1-x-w}N$, where $0.3<w\leq0.8$, $0\leq x<0.2$ and $0.3<w+x\leq1$ and has a thickness of from about 10 Å to about 50 Å and the well layer 24 comprises $Al_yIn_zGa_{1-y-z}N$ on the barrier layer, where $0<y<0.4$, $0\leq z<0.1$ and $0\leq y+z<0.5$ and has a thickness of from about 10 Å to about 30 Å. The AlGaN layer 30 comprises $Al_pGa_{1-p}N$ doped with a p-type dopant on the quantum well active region where $0.3<p\leq0.8$ and has a thickness of from about 50 Å to about 250 Å and the contact layer 32 comprises $Al_qGa_{1-q}N$ doped with a p-type dopant on the AlGaN layer 30, where $0\leq q<p$ and the contact layer 32 has a thickness of from about 200 Å to about 600 Å. The quantum well active region 20 comprises from about 3 to about 12 quantum wells of the well layer 24 and corresponding barrier layers 22.

In some embodiments of the present invention that provide light emitting devices having an output wavelength of about 340 nm, the well layer 24 comprises $Al_wIn_xGa_{1-x-w}N$, where $w=0$, $x=0$ and has a thickness of 15 Å and the barrier layer 22 comprises $Al_yIn_zGa_{1-y-z}N$ doped with silicon, where $y=0.3$, $z=0$ and has a thickness of 35 Å. The AlGaN layer 30 comprises $Al_pGa_{1-p}N$ doped with Mg on the quantum well active region where $p=0.5$ and has a thickness of 50 Å and the contact layer 32 comprises $Al_qGa_{1-q}N$ doped with Mg on the AlGaN layer 30, where $q=0$ and the contact layer 32 has a thickness of 300 Å. The quantum well active region 20 comprises ten quantum wells of the well layer and corresponding barrier layers.

In some embodiments of the present invention that provide light emitting devices having an output wavelength of about 325 nm, the well layer 24 comprises $Al_wIn_xGa_{1-x-w}N$, where $w=0.3$, $x=0$ and has a thickness of 15 Å and the barrier layer 22 comprises $Al_yIn_zGa_{1-y-z}N$ doped with silicon, where $y=0.5$, $z=0$ and has a thickness of 20 Å. The AlGaN layer 30 comprises $Al_pGa_{1-p}N$ doped with Mg on the quantum well active region where $p=0.5$ and has a thickness of 230 Å and the contact layer 32 comprises $Al_qGa_{1-q}N$ doped with Mg on the AlGaN layer 30, where $q=0$ and the contact layer 32 has a thickness of 300 Å. The quantum well active region 20 comprises ten quantum wells of the well layer and corresponding barrier layers.

In particular embodiments of the present invention where the output wavelength of the light emitting device is less than 330 nm, the GaN layer doped with an n-type dopant has a defect density of less than about $4\times10^8$ cm$^2$.

In particular embodiments of the present invention, the overall thickness of the light emitting device is about 2.5 μm or less. In further embodiments of the present invention, the overall thickness of the light emitting device is from about 1 μm to about 2.5 μm.

While embodiments of the present invention are illustrated in FIGS. 1 and 2 with reference to particular light emitting device structures, other structures may be provided according to some embodiments of the present invention. For example, in some embodiments of the present invention, a sapphire substrate, rather than a SiC substrate may be utilized. In such embodiments, a contact layer may be provided between the sapphire substrate and the quantum well active region. Thus, embodiments of the present invention may be provided on conducting or insulating substrates and as vertical or lateral devices. Likewise, while particular materials or structures are illustrated in FIGS. 1 and 2, these exemplary materials are not intended to limit the scope of the present invention other than as described herein. For example, while five quantum well structures are illustrated in FIG. 2, other numbers of quantum well structures may be utilized. Accordingly, embodiments of the present invention should not be construed as limited to the particular illustrations of FIGS. 1 and 2.

The following non-limiting examples are provided to illustrate various aspects of embodiments of the present invention.

Figure 3:
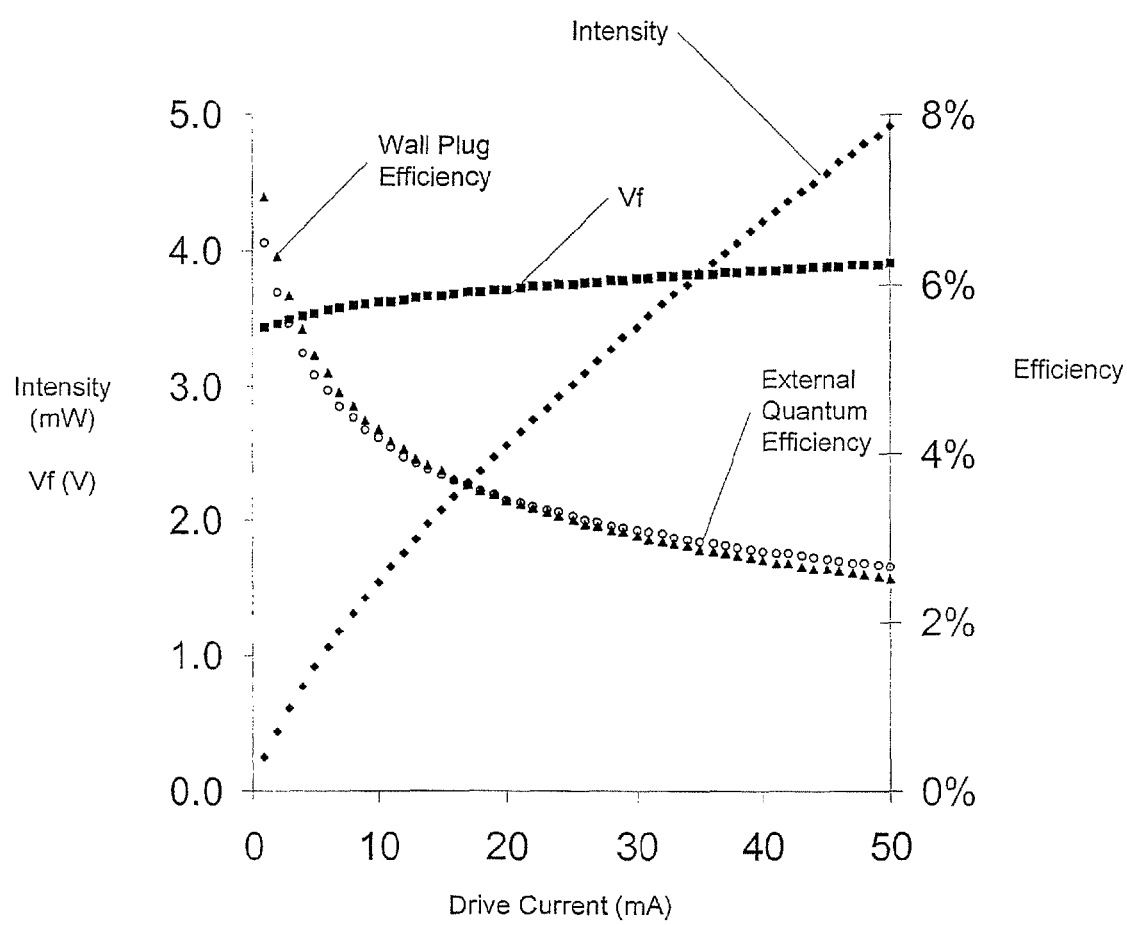
FIG. 3 is a graph of device performance of an LED according to embodiments of the present invention emitting at a peak wavelength of 335 nm.

FIG. 3 illustrates the device performance of an LED emitting at a peak wavelength of 335 nm. In this example, the device has a chip size of 290 µm×290 µm, a device mesa size of 250 µm×250 µm, and a device p-electrode size of 240 µm×240 µm. Accordingly, at a drive current of 20 mA, the device is supporting a current density of 0.347 µA/µm$^2$. The device has an output power of 2.6 mW at a forward voltage of 3.7V. The corresponding wall plug efficiency for this example at 20 mA drive current is 3.5%. As the drive current is reduced, the wall plug efficiency increases with wall plug efficiency rising above 5% for drive currents less than 5 mA.

Figure 4:
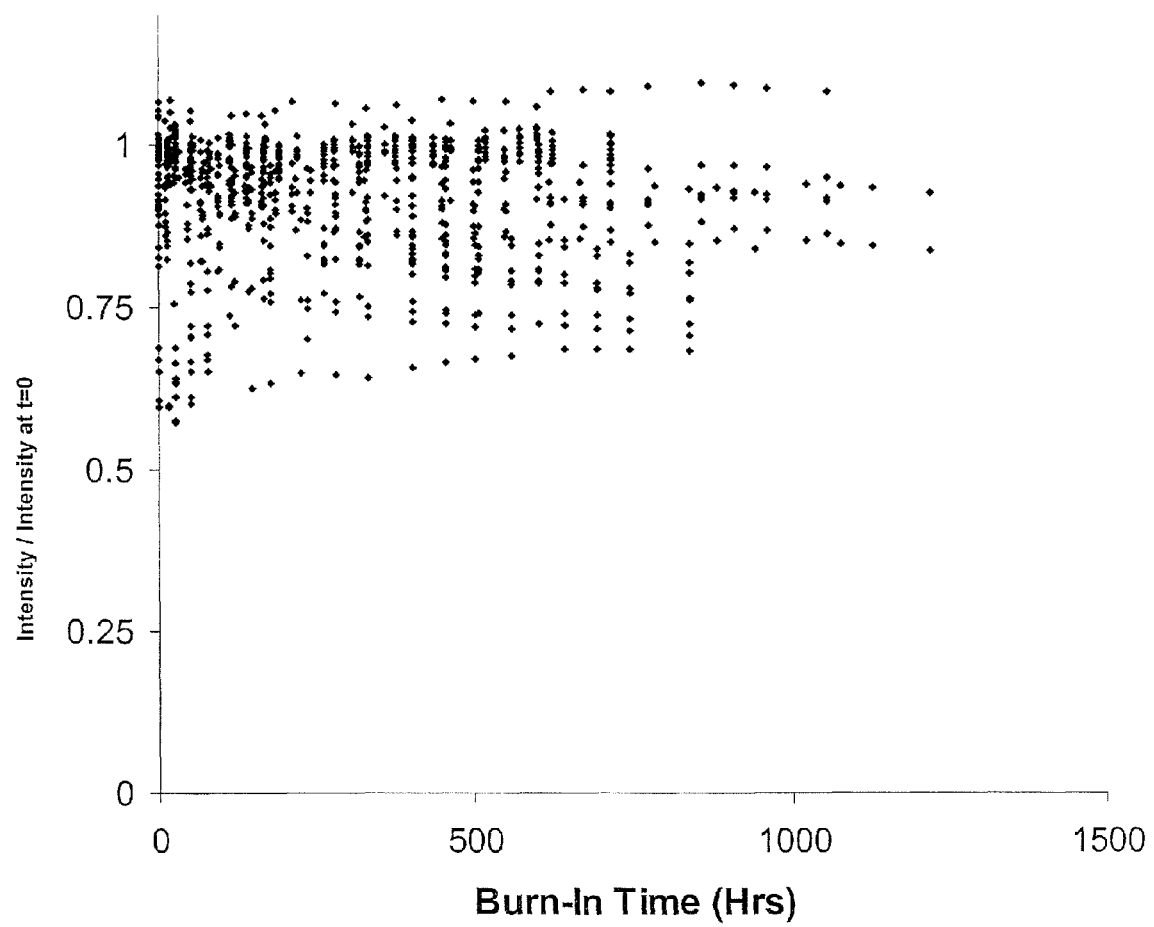
FIG. 4 is a graph of burn-in characteristics of multiple 340 nm LEDs according to embodiments of the present invention.

FIG. 4 illustrates burn-in characteristics for multiple 340 nm devices. In this example, the device has a chip size of 290 µm×290 µm, a device mesa size of 250 µm×250 µm, and a device p-electrode size of 240 µm×240 µm. Accordingly, at a drive current of 20 mA, the device is supporting a current density of 0.347 µA/µm$^2$. The devices were run in constant current mode at 20 mA and output power was measured periodically. At 1000 hours, degradation of 10-20% is observed.

In the drawings and specification, there have been disclosed embodiments of the invention and, although specific terms are employed, they are used in a generic and descriptive sense only and not for purposes of limitation, the scope of the invention being set forth in the following claims. Moreover, the claims shall not be limited to the examples and embodiments discussed herein. For example, having described semiconductor light emitting devices having a peak wavelength of not greater than 360 nm and a wall plug efficiency of at least 4%, any other semiconductor devices having these features are contemplated by the corresponding claims.

What is claimed is:

1. A light emitting device, comprising:
a low defect density base structure comprising:
   a substrate;
   a GaN-based buffer layer having a first smooth surface that is directly on the substrate and a second smooth surface that is remote from the substrate;
   a dielectric layer on the second smooth surface that is remote from the substrate; and
   a GaN layer on the dielectric layer remote from the GaN-based buffer layer;
a quantum well active region on the low defect density base structure that emits light, the quantum well active region comprising:
   a first barrier layer comprising AlGaN;
   a first well layer comprising GaN directly on the first barrier layer;
   a second barrier layer comprising AlGaN directly on the first well layer;
   a second well layer comprising GaN directly on the second barrier layer; and
   a third barrier layer comprising AlGaN directly on the second well layer;
an AlGaN layer on the quantum well active region; and
a GaN based contact layer on the AlGaN layer.

2. The light emitting device of claim 1 having a wall plug efficiency of at least 4%.

3. The light emitting device of claim 2, wherein the wall plug efficiency is at least 5%.

4. The light emitting device of claim 2, wherein the wall plug efficiency is at least 6%.

5. The light emitting device of claim 2, wherein the light emitting device has a direct current lifetime of at least 100 hours.

6. The light emitting device of claim 2, wherein the light emitting device has a direct current lifetime of at least 500 hours.

7. The light emitting device of claim 2, wherein the light emitting device has a direct current lifetime of at least 1000 hours.

8. The light emitting device of claim 2, wherein the wall plug efficiency is provided at a current density of less than about 0.35 µA/µm$^2$.

9. The light emitting device of claim 1, wherein the AlGaN layer on the quantum well active region comprises an AlGaN layer doped with a p-type dopant on the quantum well active region and the GaN based contact layer on the AlGaN layer comprises a GaN based contact layer doped with a p-type dopant.

10. The light emitting device of claim 9, wherein the p-type dopant comprises Mg.

11. The light emitting device of claim 1, wherein the first and second barrier layers are doped with Si.

12. The light emitting device of claim 1, wherein the quantum well active region comprises ten quantum well layers and eleven barrier layers with the quantum well layers being disposed between adjacent barrier layers.

13. The light emitting device of claim 1, wherein the light emitting device including the low defect density base structure, the quantum well active region, the AlGaN layer and the GaN based contact layer has an overall thickness of less than about 2.5 µm.

14. The light emitting device of claim 1 wherein the substrate comprises SiC.

15. The light emitting device of claim 1 wherein the dielectric layer comprises a discontinuous dielectric layer.

16. The light emitting device of claim 1 wherein the dielectric layer comprises a plurality of mask regions.

17. The light emitting device of claim 16 wherein the mask regions comprise SiN.

18. The light emitting device of claim 1 wherein the GaN layer on the dielectric layer is less than about 2 µm thick.

19. The light emitting device of claim 1 wherein the well layer comprises AlGaN and wherein the first and second barrier layers comprise AlGaN having a different concentration of Al than the well layer.

20. The light emitting device of claim 1 wherein the quantum well active region is configured to emit ultraviolet light.

21. The light emitting device of claim 1 wherein the quantum well active region is configured to emit light at a peak output wavelength of not greater than 360 nm.

22. The light emitting device of claim 1 wherein the quantum well active region is configured to emit light at a peak output wavelength of not greater than 345 nm.

23. The light emitting device of claim 1 wherein the quantum well active region is configured to emit light at a peak output wavelength of not greater than 330 nm.

24. The light emitting device of claim 1 wherein the GaN layer on the dielectric layer is doped with n-type dopants.

25. The light emitting device of claim 24, wherein the GaN layer doped with n-type dopants comprises a doped GaN layer having a defect density of less than about $4\times10^8$ cm$^{-2}$.

26. The light emitting device of claim 24, wherein the GaN layer doped with n-type dopants comprises GaN doped with silicon.

27. The light emitting device of claim 24 wherein the GaN layer on the dielectric layer is less than about 2 μm thick.

28. A method of fabricating a light emitting device, comprising:
    forming a low defect density base structure comprising:
        a substrate;
        a GaN-based buffer layer having a first smooth surface that is directly on the substrate and a second smooth surface that is remote from the substrate;
        a dielectric layer on the second smooth surface that is remote from the substrate; and
        a GaN layer on the dielectric layer remote from the GaN-based buffer layer;
    forming a quantum well active region on the low defect density base structure that emits light, the quantum well active region comprising:
        a first barrier layer comprising AlGaN;
        a first well layer comprising GaN directly on the first barrier layer;
        a second barrier layer comprising AlGaN directly on the first well layer;
        a second well layer comprising GaN directly on the second barrier layer; and
        a third barrier layer comprising AlGaN directly on the second well layer;
    forming an AlGaN layer on the quantum well active region; and
    forming a GaN based contact layer on the AlGaN layer.

29. The method of claim 28 wherein the light emitting device has a wall plug efficiency of at least 4%.

30. The method of claim 28 wherein the light emitting device has a direct current lifetime of at least 100 hours.

31. The method of claim 28 wherein the light emitting device has an output power of at least 3 mW at a current density of about 0.35 μA/μm$^2$.

32. The method of claim 28 wherein the dielectric layer comprises a discontinuous dielectric layer.

33. The method of claim 28 wherein the dielectric layer comprises a plurality of mask regions.

34. The method of claim 33 wherein the mask regions comprise SiN.

35. The method of claim 28 wherein the GaN layer on the dielectric layer is less than about 2 μm thick.

36. The method of claim 28 wherein the well layer comprises AlGaN and wherein the first and second barrier layers comprise AlGaN having a different concentration of Al than the well layer.

37. The method of claim 28 wherein the quantum well active region is configured to emit ultraviolet light.

38. The method of claim 28 wherein the quantum well active region is configured to emit light at a peak output wavelength of not greater than 360 nm.

39. The method of claim 28 wherein the quantum well active region is configured to emit light at a peak output wavelength of not greater than 345 nm.

40. The method of claim 28 wherein the quantum well active region is configured to emit light at a peak output wavelength of not greater than 330 nm.

41. The method of claim 28 wherein the GaN layer on the dielectric layer is doped with n-type dopants.

42. The method of claim 41 wherein the GaN layer on the dielectric layer is less than about 2 μm thick.

* * * * *